United States Patent
Pyeon (10) Patent No.: US 8,570,828 B2
(45) Date of Patent: Oct. 29, 2013

(54) MEMORY PROGRAMMING USING VARIABLE DATA WIDTH

(75) Inventor: Hong Beom Pyeon, Kanata (CA)

(73) Assignee: Mosaid Technologies Incorporated, Ottawa, Ontario (CA)

( * ) Notice: Subject to any disclaimer, the term of this patent is extended or adjusted under 35 U.S.C. 154(b) by 297 days.

(21) Appl. No.: 13/008,522

(22) Filed: Jan. 18, 2011

(65) Prior Publication Data

US 2011/0252206 A1    Oct. 13, 2011

Related U.S. Application Data

(60) Provisional application No. 61/323,202, filed on Apr. 12, 2010.

(51) Int. Cl.
*G11C 8/00* (2006.01)

(52) U.S. Cl.
USPC .................. 365/235; 365/189.16; 365/238.5

(58) Field of Classification Search
USPC ................................. 365/235, 189.16, 238.5
See application file for complete search history.

(56) References Cited

U.S. PATENT DOCUMENTS

| | | | |
|---|---|---|---|
| 5,944,837 A * | 8/1999 | Talreja et al. ................. | 713/600 |
| 6,466,476 B1 | 10/2002 | Wong et al. | |
| 7,643,334 B1 | 1/2010 | Lee et al. | |
| 7,724,570 B1 * | 5/2010 | Lindhorst et al. ......... | 365/185.08 |
| 2004/0052137 A1 * | 3/2004 | Hazama ........................ | 365/202 |
| 2009/0228662 A1 * | 9/2009 | Chang et al. .................. | 711/148 |

OTHER PUBLICATIONS

International Search Report and Written Opinion for PCT/CA2011/000383 on Jun. 9, 2011, 14 pages.
Kang et al., "A 0.1um 1.8V 256Mb 66Mhz Synchronous Burst PRAM," IEEE International Solid-State Circuits Conference, 1-4244-0079-1/06, 2006; 10 pgs.
Lee et al., "A 90 nm 1.8 V 512 Mb Diode-Switch PRAM With 266 MB/s Read Throughput," IEEE Journal of Solid-State Circuits, vol. 43, No. 1, Jan. 2008; 13 pgs.
Yang et al., "A Low Power Phase-Change Random Access Memory using a Data-Comparison Write Scheme," IEEE International Symposium on Circuits and Systems, May 2007; 4 pgs.
Yang et al., "A Low Power PRAM using a Power-Dependant Data Inversion Scheme," 2nd International Conference on Memory Technology and Design, May 7-10, 2007; 4 pgs.

* cited by examiner

*Primary Examiner* — Vu Le
*Assistant Examiner* — Han Yang
(74) *Attorney, Agent, or Firm* — Harvey Auerback (57) ABSTRACT

A memory system comprises a memory including a plurality of bits arranged as one or more words. Each bit in each word is capable of being programmed either to a particular logical state or to another logical state. A variable data width controller is in communication with the memory. The variable data width controller comprises an adder to determine a programming number of bits in a word to be programmed into a memory. Each bit to be programmed is in the particular logical state. A partitioning block divides the word in to two or more sub-words when the programming number exceeds a maximum number. A switch is in communication with the partitioning block. The switch sequentially provides one or more write pulses. Each write pulse enables a separate communication path between the memory and one of the word and the sub-words.

19 Claims, 9 Drawing Sheets

MEMORY PROGRAMMING USING VARIABLE DATA WIDTH

CROSS-REFERENCE TO RELATED APPLICATIONS

This application is a utility application claiming priority to co-pending U.S. Provisional Application Ser. No. 61/323,202 filed on Apr. 12, 2010 entitled "FAST PROGRAMMING WITH VARIABLE WRITE DATA WIDTH OF PCM CELL," the entirety of which is incorporated by reference herein.

FIELD OF THE INVENTION

The invention relates generally to non-volatile memory programming. More specifically, the invention relates to a variable write data width that allows a user to optimize write speed without exceeding programming limits.

BACKGROUND

Phase change memory (PCM) devices store data using phase change materials, such as chalcogenide, which are capable of stably transitioning between amorphous and crystalline phases. The amorphous and crystalline phases (or states) exhibit different resistance values used to distinguish different logic states of memory cells in the memory devices. In particular, the amorphous phase exhibits a relatively high resistance and the crystalline phase exhibits a relatively low resistance.

At least one type of phase change memory device, PRAM (phase-change random access memory), uses the amorphous state to represent a logical '1' and the crystalline state to represent a logical '0'. In a PRAM device, the crystalline state is referred to as a "SET state" and the amorphous state is referred to as a "RESET state". Accordingly, a memory cell in a PRAM stores a logical '0' by setting a phase change material in the memory cell to the crystalline state, and the memory cell stores a logical '1' by setting the phase change material to the amorphous state.

The phase change material in a PRAM is converted to the amorphous state by heating the material to a first temperature above a predetermined melting temperature and then quickly cooling the material. The phase change material is converted to the crystalline state by heating the material at a second temperature lower than the melting temperature but above a crystallizing temperature for a sustained period of time. Accordingly, data is programmed to memory cells in a PRAM by converting the phase change material in memory cells of the PRAM between the amorphous and crystalline states using heating and cooling as described above.

The phase change material in a PRAM typically comprises a compound including germanium (Ge), antimony (Sb), and tellurium (Te), known in the art as a "GST" compound. The GST compound is well suited for a PRAM because it can quickly transition between the amorphous and crystalline states by heating and cooling. In addition to, or as an alternative for the GST compound, a variety of other compounds can be used in the phase change material. Examples of the other compounds include, but are not limited to, 2-element compounds such as GaSb, InSb, InSe, $Sb_2Te_3$, and GeTe, 3-element compounds such as GeSbTe, GaSeTe, InSbTe, $SnSb_2Te_4$, and InSbGe, or 4-element compounds such as AgInSbTe, (GeSn)SbTe, GeSb(SeTe), and $Te_{si}Ge_{15}Sb_2S_2$.

The memory cells in a PRAM are called "phase change memory cells". A phase change memory cell typically comprises a top electrode, a phase change material layer, a bottom electrode contact, a bottom electrode, and an access transistor. A READ operation is performed on the phase change memory cell by measuring the resistance of the phase change material layer, and a PROGRAM or WRITE operation is performed on the phase change memory cell by heating and cooling the phase change material layer as described above.

Figure 1:
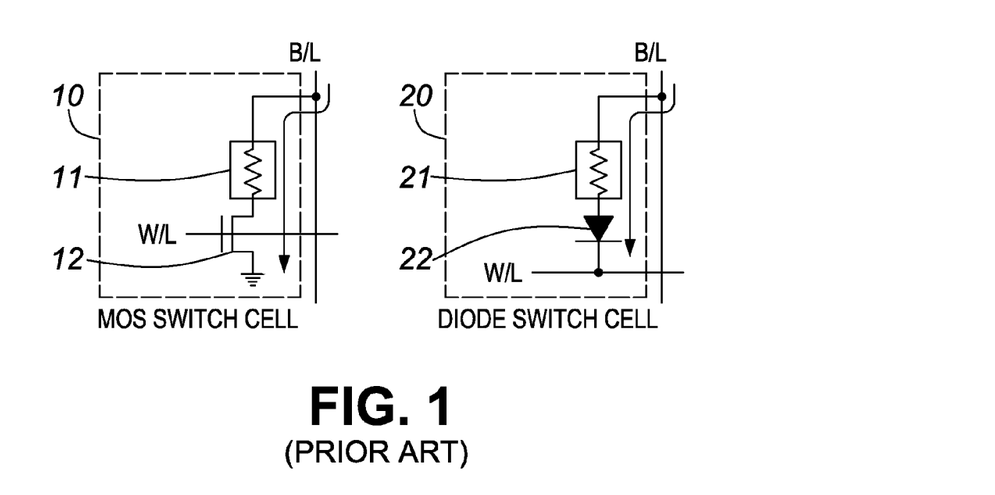
FIG. 1 is a schematic diagram of a conventional NMOS switch PCM cell and a conventional diode switch PCM cell.

FIG. 1 is a circuit diagram illustrating a conventional phase change memory cell with MOS Switch Cell (or memory cell) 10 and a conventional diode type phase change memory cell 20. Referring to FIG. 1, memory cell 10 includes a phase change resistance element 11 comprising the GST compound, and a negative metal-oxide semiconductor (NMOS) transistor 12. Phase change resistance element 11 is connected between a bit line (BL) and NMOS transistor 12, and NMOS transistor 12 is connected between phase change resistance element 11 and ground. In addition, NMOS transistor 12 has a gate connected to a word line (WL).

NMOS transistor 12 is turned on in response to a word line voltage applied to word line WL. Where NMOS transistor 12 is turned on, phase change resistance element 11 receives a current through bit line BL. Phase change resistance element 11 is connected between bit line BL and the drain terminal of the NMOS transistor 12 in FIG. 1.

Referring again to FIG. 1, memory cell 20 comprises a phase change resistance element 21 connected to a bitline BL, and a diode 22 connected between phase change resistance element 21 and a wordline WL.

Phase change memory cell 20 is accessed by selecting wordline WL and bitline BL. In order for phase change memory cell 20 to work properly, wordline WL must have a lower voltage level than bitline BL when wordline WL is selected so that current can flow through phase change resistance element 21. Diode 22 is forward biased so that if wordline WL has a higher voltage than bitline BL, no current flows through phase change resistance element 21. To ensure that wordline WL has a lower voltage level than bitline BL, wordline WL is generally connected to ground when selected.

In FIG. 1, phase change resistance elements 11 and 21 can alternatively be broadly referred to as "memory elements" and NMOS transistor 12 and diode 22 can alternatively be broadly referred to as "select elements".

Figure 2:
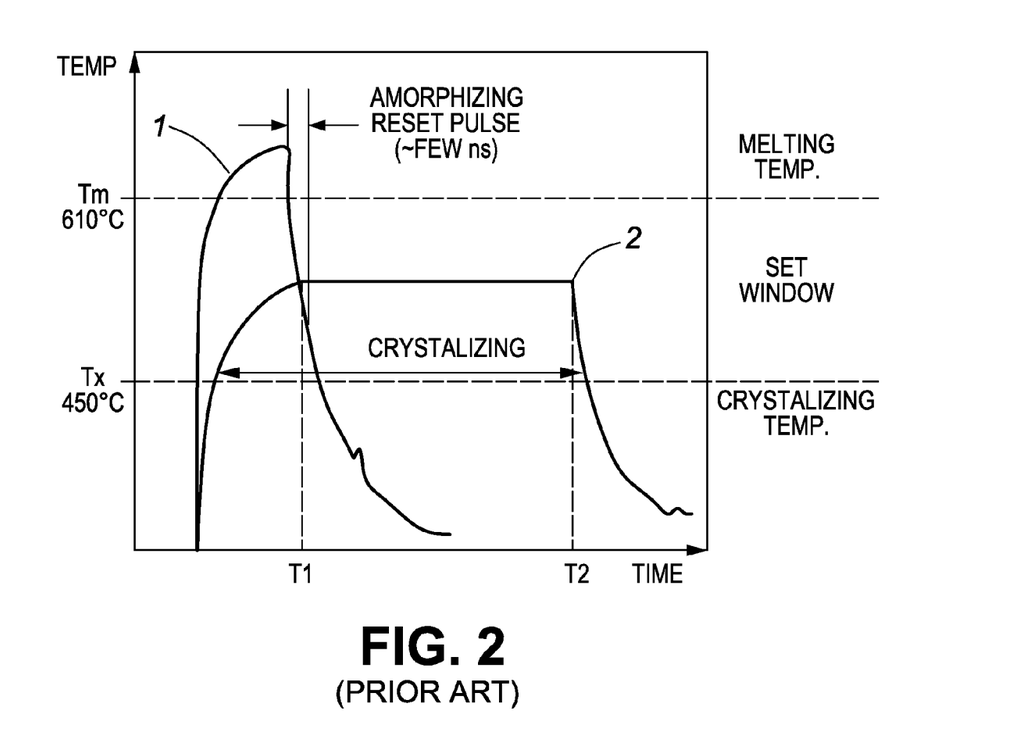
FIG. 2 is a graph of temperature change during a SET and a RESET operation of a conventional PCM cell.

The operation of phase change memory cells 10 and 20 is described herein below with reference to FIG. 2. In particular, FIG. 2 is a graph illustrating temperature characteristics of phase change resistance elements 11 and 21 during programming operations of memory cells 10 and 20. In FIG. 2, a reference numeral 1 denotes temperature characteristics of phase change resistance elements 11 and 21 during a transition to the amorphous state, and a reference numeral 2 denotes temperature characteristics of phase change resistance elements 11 and 21 during a transition to the crystalline state.

Referring to FIG. 2, in a transition to the amorphous state, a current is applied to the GST compound in phase change resistance elements 11 and 21 for a duration T1 to increase the temperature of the GST compound above a melting temperature Tm. After duration T1, the temperature of the GST compound is rapidly decreased, or "quenched", and the GST compound assumes the amorphous state. On the other hand, in a transition to the crystalline state, a current is applied to the GST compound in phase change resistance elements 11 and 21 for an interval T2 (T2>T1) to increase the temperature of the GST compound above a crystallization temperature Tx. At T2, the GST compound is slowly cooled down below the crystallization temperature so that it assumes the crystalline state.

A phase change memory device typically comprises a plurality of phase change memory cells arranged in a memory cell array. Within the memory cell array, each of the memory cells is typically connected to a corresponding bit line and a corresponding word line. For example, the memory cell array may comprise bit lines arranged in columns and word lines arranged in rows, with a phase change memory cell located near each intersection between a column and a row.

Typically, a row of phase change memory cells connected to a particular word line is selected by applying an appropriate voltage level to the particular word line. For example, to select a row of phase change memory cells similar to phase change memory cell 10 illustrated in the left side of FIG. 1, a relatively high voltage level is applied to a corresponding word line WL to turn on NMOS transistor 12. Alternatively, to select a row of phase change memory cells similar to phase change memory cell 20 illustrated in the right side of FIG. 1, a relatively low voltage level is applied to a corresponding word line WL so that current can flow through diode 22.

Unfortunately, conventional PRAM devices can receive several bits of input at the same time but are unable to simultaneously program the bits into corresponding memory cells. For example, a PRAM may receive 16 inputs through a plurality of pins, but the PRAM may not be able to simultaneously access 16 phase change memory cells. One reason for this shortcoming is that if a current of 1 mA is required to program one phase change memory cell, then a current of 16 mA would be required to simultaneously program 16 phase change memory cells. Moreover, if the efficiency of a driver circuit providing the current is 10%, then a current of 160 mA would be required to simultaneously program the 16 memory cells. However, conventional PRAM devices are generally not equipped to provide currents with such high magnitudes.

A paper by Samsung of Hwasung, Korea ("A 0.1 μm 1.8V 256 Mb 66 MHz Synchronous Burst PRAM", 2006 IEEE International Solid-State Circuits Conference 1-4244-0079-1/06) shows a write mode selector, which can determine the write data width ranging from X2 to X16 depending on the operating environment. If the write performance is more important and the system power can support 16 mA, the X16 mode would be selected. In other cases, smaller write data width will help reduce the total peak power and average operating power. Another approach to resolve a high current requirement for RESET programming, even with an external pin driving method, has also been proposed by Samsung ("A 90 nm 1.8V 512 Mb Diode-Switch PRAM With 266 MB/s Read Throughput", IEEE Journal Of Solid-State Circuits, VOL. 43, NO. 1, January 2008). However, this method is manually selected by the user and does not provide an automated and optimized way to improve the total write performance and reduce power consumption.

Another approach is to use data comparison write (DCW), which reduces the write power ("A Low Power Phase-Change Random Access Memory using a Data-Comparison Write Scheme", Byung-Do Yang, et al., IEEE International Symposium on Circuits and Systems, May 2007). The DCW circuit reads stored values from PCM cells during write operation, and then it writes into the PCM cells where the input and stored values are different. If the PCM cell value does not change, it does not consume write power.

Figure 3:
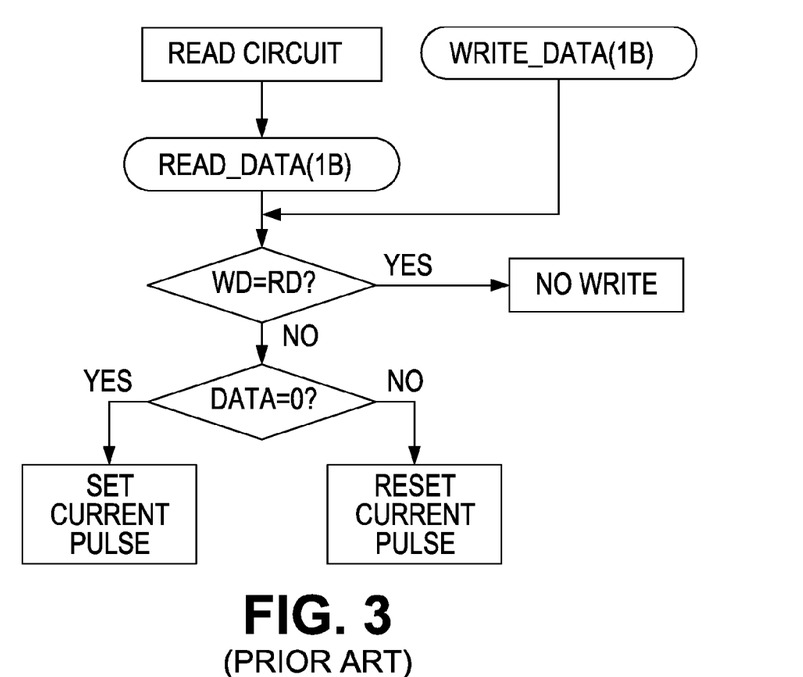
FIG. 3 is a flowchart of a conventional data comparison write scheme.

FIG. 3 shows a flowchart of the data comparison write (DCW) scheme. The DCW scheme performs the READ (RD) operation before the WRITE (WR) operation to determine the previously stored value in the selected PCM cell. If the input and stored values are the same, no WRITE operation is performed. This comparison is done with bit-based comparison. Only different bit write data is programmed into the PCM cell. This way, the DCW scheme does not consume the write power for two cases (0→0, 1→1). Therefore, the average power consumption is given by (Pset+Preset)/4, where Pset is the power consumed for the SET operation and Preset is the power consumer for the RESET operation. However, most of the data inputs are random patterns so the situations where power is reduced is minimal. Additionally, there are no power savings for maximum RESET programming cases where all data pattern undergo a transition in the same cycle.

Another approach is to use a data inversion scheme ("A Low Power PRAM using a Power-Dependant Data Inversion Scheme", Byung-Do Yang et al., 2nd International Conference on Memory Technology and Design, May 7-10, 2007, Giens, France). This approach requires one additional polarity bit for the write data to determine whether or not all bits should be inverted.

BRIEF SUMMARY

In one aspect, the invention features a method of programming a memory comprising determination of a programming number of bits in a word to be programmed into a memory wherein each bit to be programmed is in a particular logical state. The word is partitioned into two or more sub-words when the programming number exceeds a maximum number. Each of the sub-words is sequentially written into the memory.

In another aspect, the invention features a variable data width system comprising an adder to determine a programming number of bits in a word to be programmed into a memory wherein each bit to be programmed is in a particular logical state. A partitioning block divides the word into two or more sub-words when the programming number exceeds a maximum number. Each sub-word includes a same number of bits as each other sub-word. A switch is in communication with the partitioning block. The switch sequentially provides one or more write pulses. Each write pulse enables a separate communication path between the memory and one of the word and the sub-words.

In another aspect, the invention features a memory system comprising a memory including a plurality of bits arranged as one or more words. Each bit in each word is capable of being programmed either to a particular logical state or to another logical state. A variable data width controller is in communication with the memory. The variable data width controller comprises an adder to determine a programming number of bits in a word to be programmed into a memory wherein each bit to be programmed is in the particular logical state. A partitioning block divides the word into two or more sub-words when the programming number exceeds a maximum number. A switch is in communication with the partitioning block. The switch sequentially provides one or more write pulses. Each write pulse enables a separate communication path between the memory and one of the word and the sub-words.

BRIEF DESCRIPTION OF THE SEVERAL VIEWS OF THE DRAWINGS

The above and further advantages of this invention may be better understood by referring to the following description in conjunction with the accompanying drawings, in which like numerals indicate like structural elements and features in various figures. The drawings are not necessarily to scale, emphasis instead being placed upon illustrating the principles of the invention.

DETAILED DESCRIPTION

Figure 4:
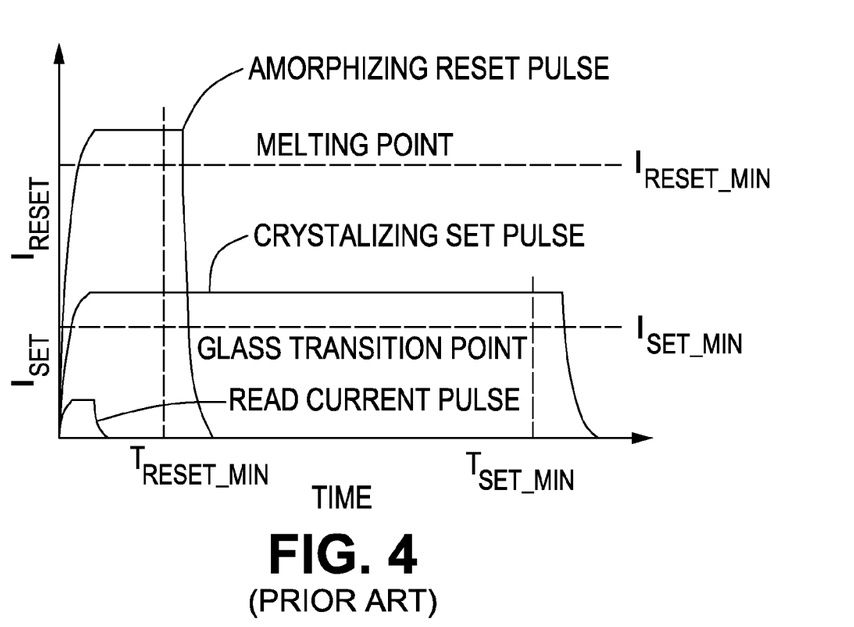
FIG. 4 is a graph of current pulses during the READ, SET and RESET operations of a conventional PCM cell.

As shown in FIG. 4, programming the RESET state requires significantly more current than the SET state. Data to be written includes a combination of bits, where each bit is to be programmed either to the RESET state or the SET state. In the example shown in FIG. 4, the RESET state is considered to be logic "1" and the SET state is considered to be a logic "0". In other embodiments a RESET state may be a logic "0" and the SET state may be a logic "1".

A variable write data width system is implemented by recognizing how many bits are to be programmed to the RESET state, (a state which requires more current than the SET state), and then, when required, partitions the word into one or more sub-words to ensure that the maximum programming current limit of the system is not exceeded. This results in a higher performance WRITE operation by dynamically maximizing the write word width while also ensuring lower peak current consistent within the limits of a particular system.

Unlike the inversion scheme proposed by Byung-Do Yang et al., supra, the embodiments described herein preferably do not need an additional memory bit to store the inversion state. The extra logic required by the variable write data width approach is confined to the peripheral area. This typically results in significantly less overall system area compared to the approach, which requires adding an extra bit to every word stored in the memory.

Figure 5:
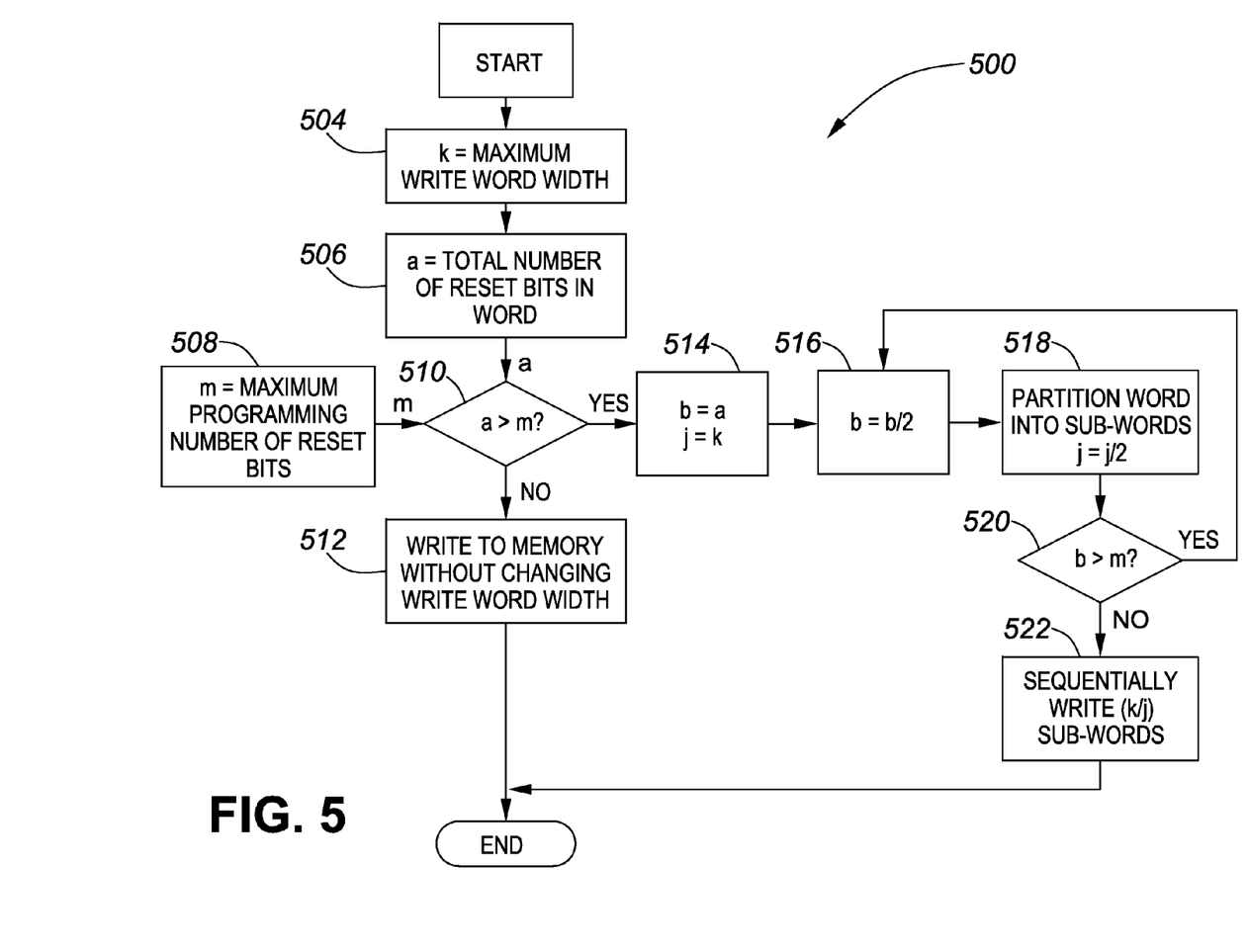
FIG. 5 is a flowchart of a method in accordance with an embodiment of the invention.

FIG. 5 is a flow chart of one embodiment of the variable write data width scheme. In one embodiment, the maximum word width ("k") is set to 16 bits at step 504 and the maximum programming number ("m") of RESET bits is set to 4 at step 508. It should be understood that any word width is accommodated in other embodiments. It should also be understood that the maximum programming number also varies with other embodiments. By way of example and not limitation, the maximum programming number is set based on the peak current available from a charge pump used to activate the word-line of a plurality of memory cells, or is set based on electromagnetic interference (EMI) limits due to radiated noise from peak switching, or is set based on the demands that instantaneous current switching makes on power supplies and the electro-migration limits of on-chip interconnect. The parameter "m" is also envisioned to be updated by the user or automatically by a memory system when switching from a mission mode to a low power standby mode, or based on operating temperature or voltage. In the embodiment of FIG. 5, where k=16 and m=4, attempting to write a word with bits '0001010001111000' (or 1478h in hexidecimal) results in a total number of 6 RESET bits, thus "a" is set to 6 at step 506. Because "a" exceeds "m" the comparison at step 510 is not satisfied. Parameter "b" is then set to "a" and parameter "j" is set to "k" at step 514. Parameter "b" is then provisionally divided in half at step 516 and the word is divided in half at step 518. The condition that the revised total number of RESET bits "b" must not exceed the maximum programming number "m" is retested at step 520. If "b" still exceeds "m" then steps 516 and 518 are repeated until the "b" no longer exceeds "m". At that point the resulting binary multiple of sub-words are each sequentially written to the memory at step 522. It should be understood that the resulting sub-words can be written to the memory in any order. In the present example embodiment where the total number of reset bits "a" in a 16 bit word is determined to be 6 and the maximum programming number of RESET bits "m" is 4, two sub-words result and two write operations of 8 bits each results.

In one embodiment, the maximum write word data width 'k' is a fixed number determined by the number of external input/output pins, but the resulting internal data written to the memory is a sub-word depending on how many RESET bits are contained in the external word. For example, in one embodiment a 16 bit external word is divided into a sub-word of 8 bits, 4 bits or 2 bits.

Figure 6:
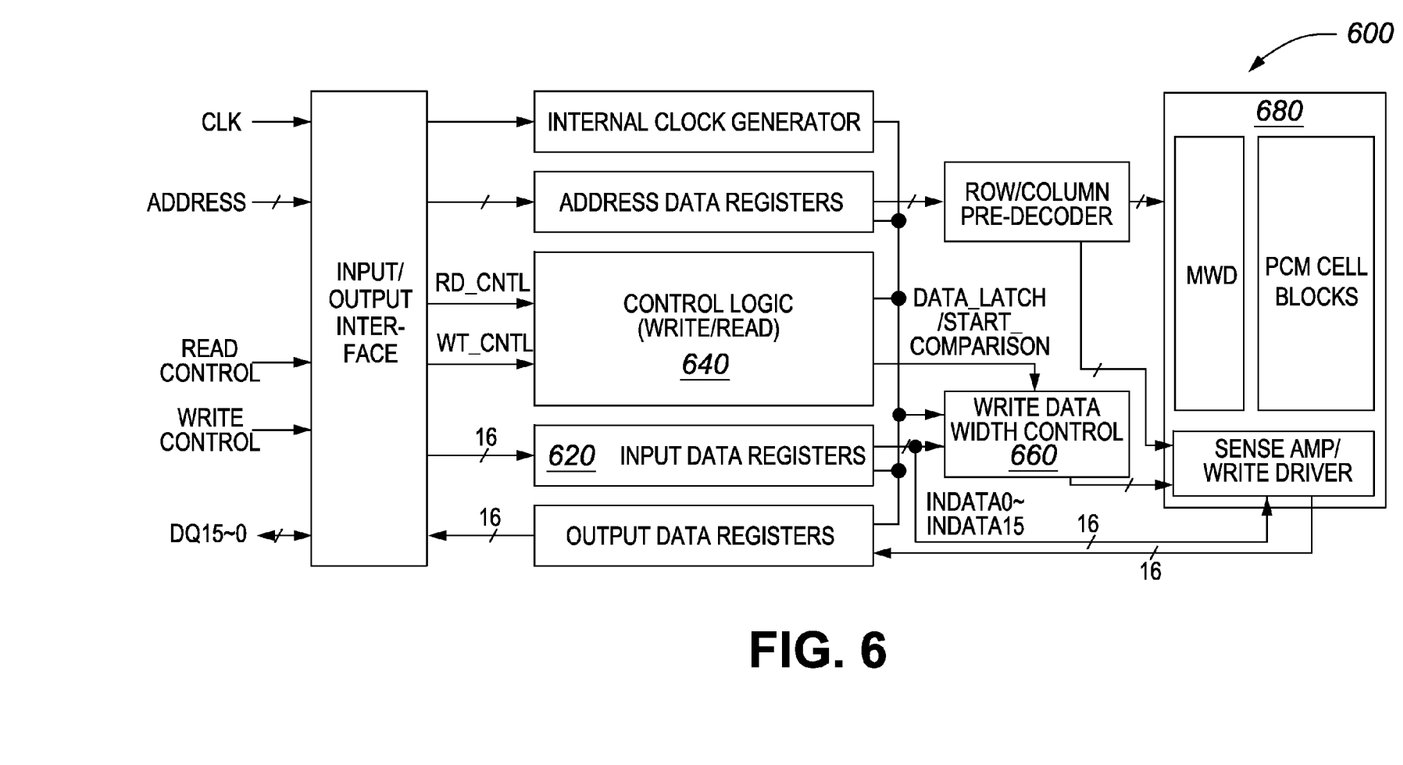
FIG. 6 is a block diagram of a PRAM including a "Write data width control" block in accordance with an embodiment of the invention.

FIG. 6 shows an embodiment 600 of the variable write data width control in a memory system. The input data is first stored in input data registers 620 and then transferred to a write data width control block 660 where the number of bits to be programmed to the RESET state is analyzed against the maximum programming number. The embodiment 600 shows a phase change memory (PRAM) 680, although it is envisioned that other types of memory will be used with a variable write data width, including but not limited to a magneto-resistive RAM and a charge based RAM.

Figure 7:
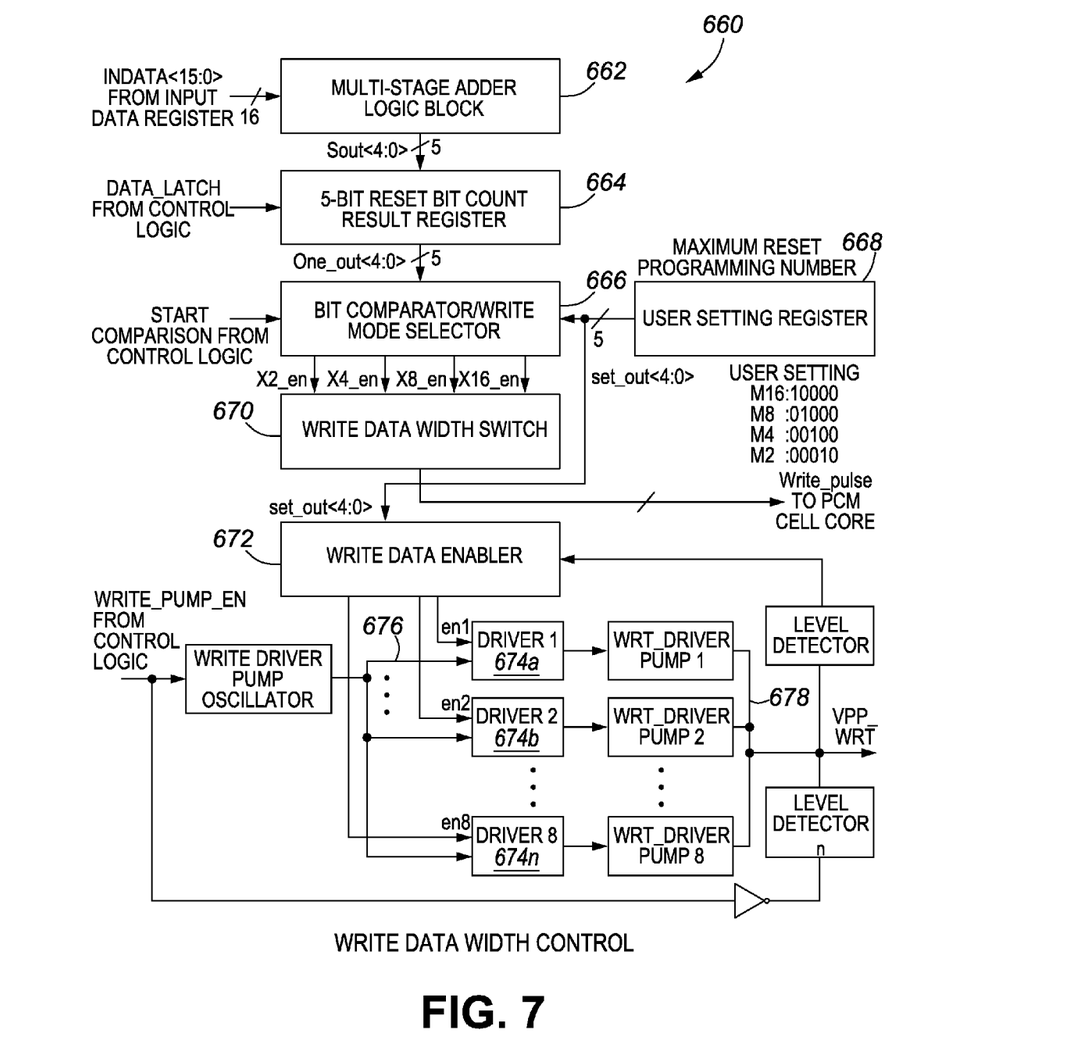
FIG. 7 is a block diagram of a "Write data width control" block shown in FIG. 6.

In FIG. 7, the 'write data width control' block 660 performs the operation of analyzing the total number of logic '1' states in the word to be written and then partitioning the word into one or more sub-words and sequentially writing each sub-word to the memory, so that each word or sub-word to be written will not exceed the maximum programming limits set by the maximum programming number. First, the multi-stage adder logic block 662 receives an input data from the input data registers 620 shown in FIG. 6. The multi-stage adder logic block 662 determines the total number of bits with a RESET state (in one embodiment defined as logic '1"), and output the sum of the bits with a RESET state as parameter Sout<4:0>.

The 5-bit RESET bit count result register 664 then latches the Sout<4:0> value as One_out<4:0> under the control of the control logic block 640 shown in FIG. 6. A bit comparator and write mode selector 666 then compares the value in One_out<4:0> against a maximum reset programming number contained in the user setting register 668 according to the method described in FIG. 5 and activates one of the X16_en, X8_en, X4_en and X2_en signals. The X16_en signal is enabled when the word need not be divided and can be written into the memory 680 in a single cycle. The X8_en signal is enabled when the word is divided into two sub-words and written into the memory 680 in two cycles. The X4_en signal is enabled when the word is divided into four sub-words and written into the memory 680 in four cycles. The X2_en signal is enabled when the word is divided into eight sub-words and written into the memory 680 in eights cycles.

The signals X16_en, X8_en, X4_en and X2_en control the partitioning of the word into sub-words and also are inputs to the "write data width switch" 670, which provides one, two, four and eight write pulses respectively. In one embodiment the signals X16_en, X8_en, X4_en and X2_en control the column select gates of a memory. For example, if the X8_en signal is active, then in one cycle half of the column select gates corresponding to half of the word are enabled in the first cycle, then the other half of the column-select gates corresponding to the other half of the word are enabled in the second subsequent cycle. It is not necessary that the first half the column-select gates or the second half of the column select gates be adjacent to one another.

In addition to providing an input to the bit comparator and write mode selector 666, the user setting register 668 also is an input to the write driver enabler 672. In one embodiment, the write driver enabler 672 enables one or more drivers 674a through 674h (generally 674), each with a common charge pump input 676 and a common driver output 678 to provide the necessary programming current set by the user setting register 668. In another embodiment, the write driver enabler 672 controls the strength of a single driver.

Figure 8:
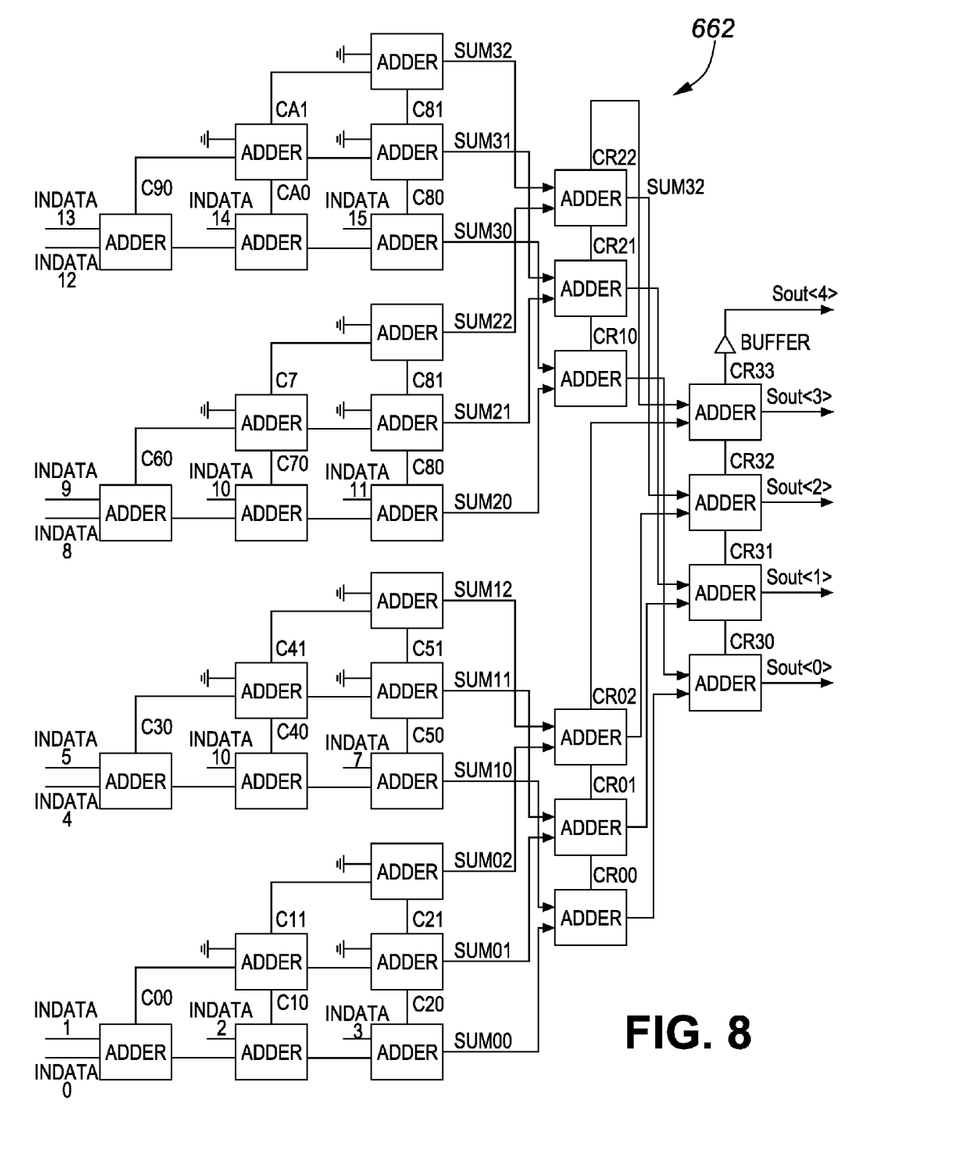
FIG. 8 is a block diagram of a "Multi-stage adder logic block" shown in FIG. 7.

Referring to FIG. 8, the "multi-stage adder logic block 662 calculates the number of bits to be programmed to the RESET state (or logic "1" in one embodiment) by using an adder. In one embodiment, the adder is an asynchronous multi-stage adder comprising a plurality of two-input adders, each with a carry output. Using asynchronous adders improves computational latency over a clocked system by performing the addition within the propagation delay of five adder stages rather than multiple clock cycles. In the embodiment of an adder shown in FIG. 8, each of four of the sixteen inputs from the input data register 620 are added in a three-stage adder to generate a 3-bit output, sum0<0:2> for example. Each of the 3-bit outputs are then added in a subsequent two stage adder to generate Sout<0:4>. In one embodiment the full addition of all logic "1" bits in a 16 bit word is accomplished within a single cycle of a system clocked at 133 Mhz.

Figure 9:
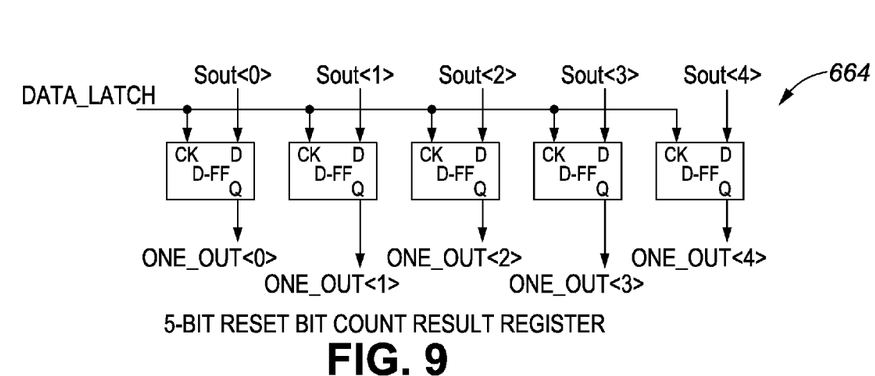
FIG. 9 is a logic diagram of a "5-bit RESET bit count register" shown in FIG. 7.

The 5-bit RESET bit count result register 664 shown in FIG. 9, is a simple register which includes multiple D-FF to store the input Sout<4:0> until the next write operation is issued. Other types of flip-flops may be used, a J-K flop for example.

Figure 10:
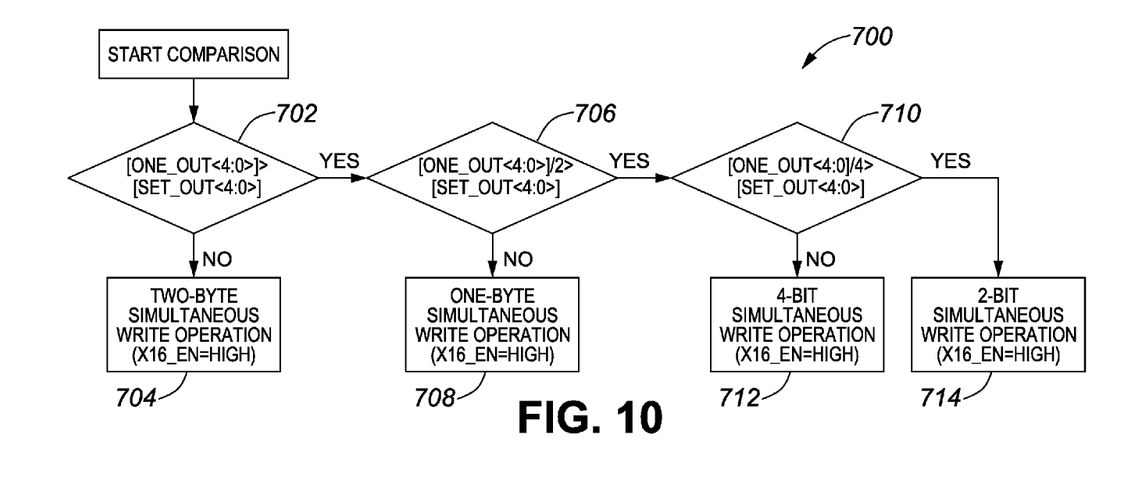
FIG. 10 is a flowchart of a bit comparison and write mode selector method in accordance with an embodiment of the invention.

An method for implementing the bit comparator and write mode selector 666 is shown in FIG. 10. When the One_out<4:0> value (hereinafter "a") is not greater than the set_out<4:0> value (hereinafter "b") at step 702, then the full 16 bits are written in one cycle at step 704, otherwise proceed to step 706. When "b/2" is not greater than "a" at step 706, then two 8 bit values ("bytes") are written in two sequential cycles at step 708, otherwise proceed to step 710. When "b/4" is not greater than "a" at step 710, then four 4-bit values ("nibbles") are written in four sequential cycles at step 712, otherwise eight 2-bit values are written in eight sequential cycles at step 714. The value of "b" can be divided by two and by four by shifting the bits. For example, in a four bit word One_out<4:0> including a most significant bit One_out<4> and a least significant bit One_out<0>, dividing by two is accomplished by shifting all bits by one position or more specifically by concurrently replacing One_out<0> with One_out<1>, replacing One_out <1> with One_out<2> and replacing One_out<2> with One_out<3>.

Figure 11A:
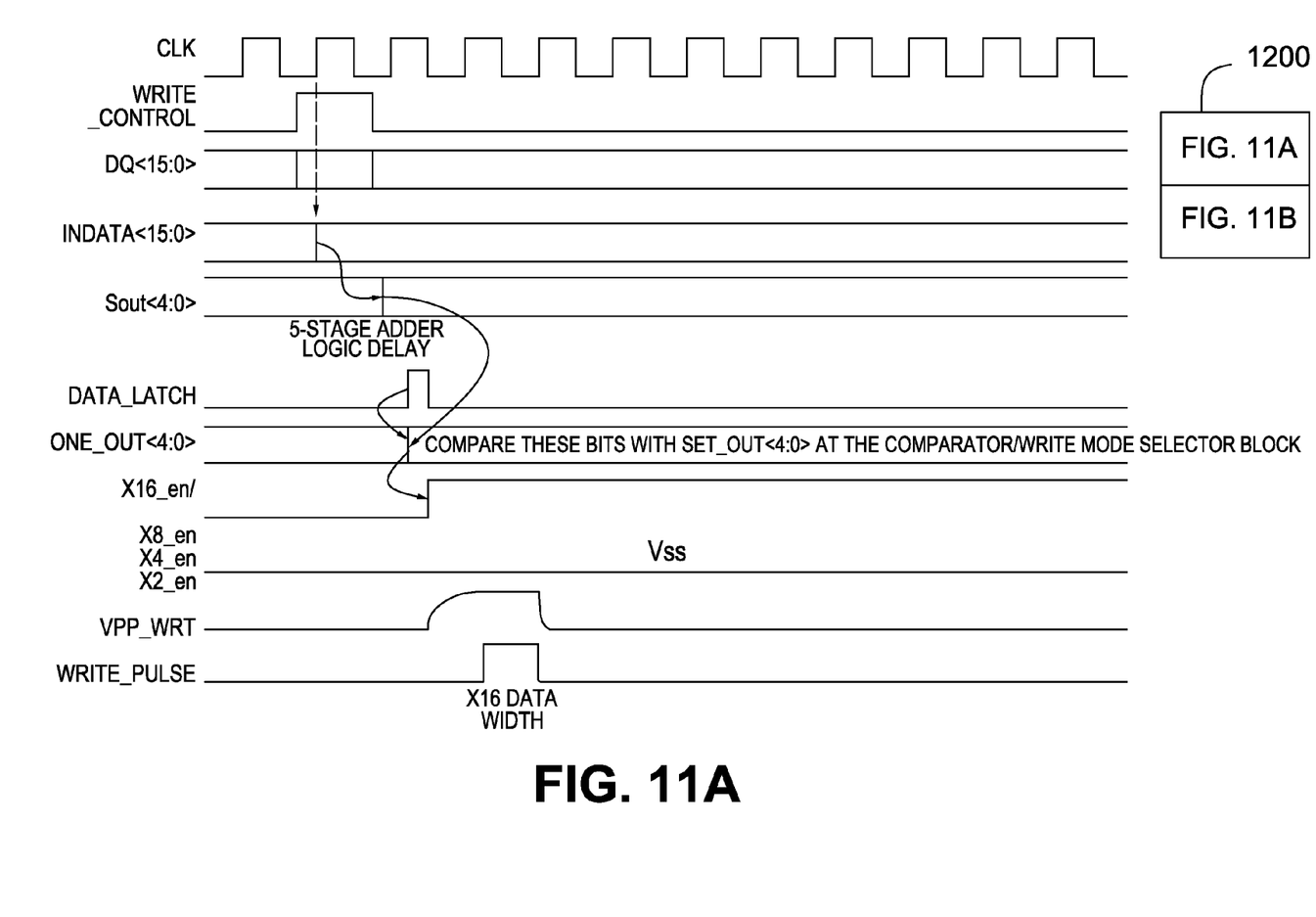
FIGS. 11A and 11B collectively are a timing diagram of an embodiment of the variable write data width control according to the invention.
Figure 11B:
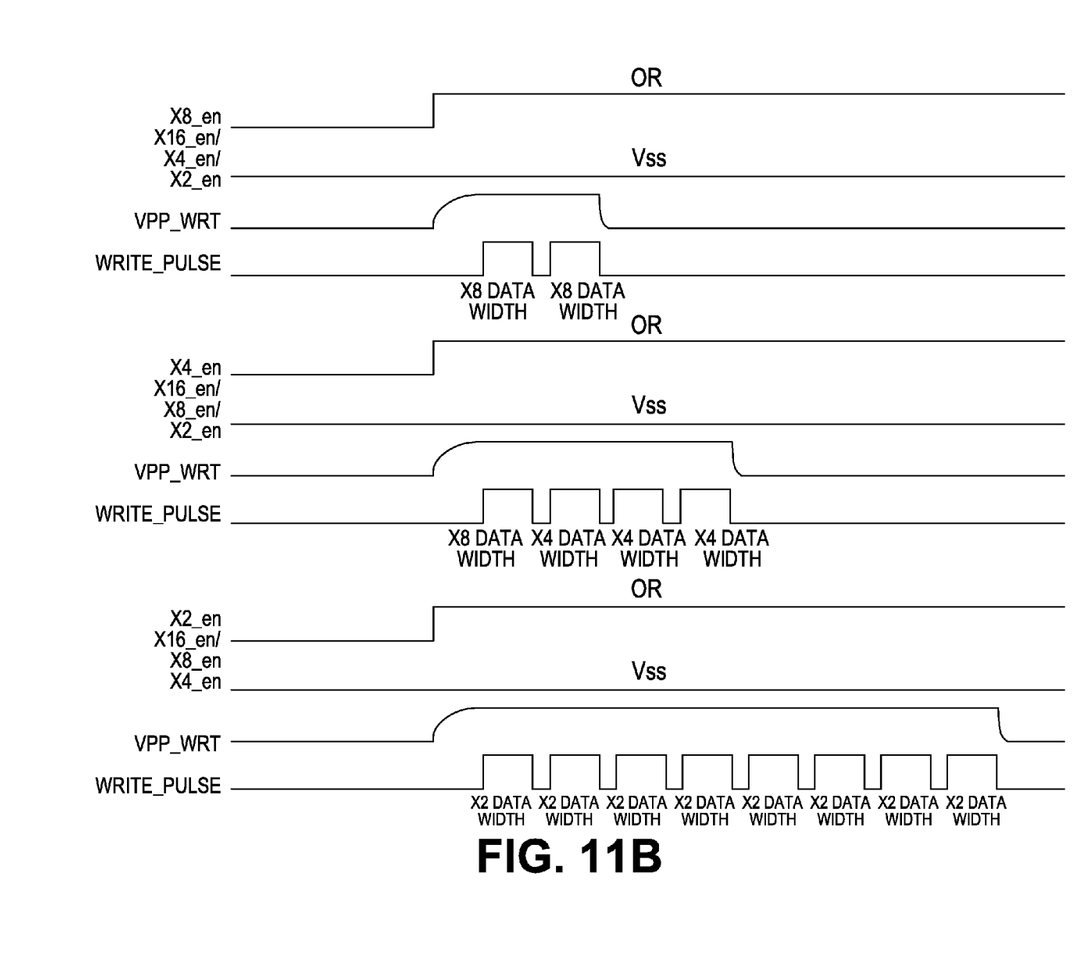

FIG. 11A shows a timing diagram of the PRAM memory system shown in FIG. 6 with details regarding the "Write Data Width Control" block as shown in FIG. 7. FIG. 11A shows the timing when the X16_en signal is enable. Similarly, FIG. 11B shows the timing when each of the X8_en, X4_en and X2_en signals are enabled. A key 1200 in FIG. 11A shows the relative positions of FIGS. 11A and 11B, specifically with respect to signals CLK through One out<4:0>, which are shared between FIGS. 11A and 11B.

Advantageously, a variable data width control method in accordance with embodiments of the present invention provide simultaneous high performance write programming and low peak current due to RESET programming in a PRAM.

While the invention has been shown and described with reference to specific preferred embodiments, it should be understood by those skilled in the art that various changes in form and detail may be made therein without departing from the spirit and scope of the invention as defined by the following claims.

What is claimed is:

1. A method of programming a memory comprising:
   determining a programming number of bits in a word to be programmed into a memory wherein each bit to be programmed is in a particular logical state, the determining comprising asynchronously adding;
   partitioning the word into two or more sub-words when the programming number exceeds a maximum number; and
   sequentially writing each of the sub-words into the memory.

2. The method of claim 1 wherein partitioning the word further comprises dividing the word into a binary multiple of sub-words, each sub-word including a same number of bits as each other sub-word.

3. The method of claim 1 wherein the particular logical state is a RESET state.

4. A variable data width system comprising:
   an adder configured to determine a programming number of bits in a word to be programmed into a memory wherein each bit to be programmed is in a particular logical state, the adder comprising a plurality of asynchronous adders;
   a partitioning block configured to divide the word into two or more sub-words when the programming number exceeds a maximum number, each sub-word including a same number of bits as each other sub-word; and
   a switch in communication with the partitioning block, the switch being configured to sequentially provide one or more write pulses, each write pulse enabling a separate communication path between the memory and one of the word and the sub-words.

5. The system of claim 4 further comprising a register holding the programming number until a completion of a subsequent write operation.

6. The system of claim 4 further comprising a register in communication with the partitioning block and adapted to store the maximum number therein.

7. The system of claim 6 further comprising a write driver enabler in communication with the register, the write driver enabler selecting a driver strength in response to the maximum number.

8. The system of claim 6 further comprising a write driver enabler in communication with the register, the write driver enabler selecting a one or more drivers in response to the maximum number, all of the one or more drivers having a common charge pump input and a common driver output.

9. The system of claim 4 wherein the partitioning block comprises a plurality of combinatorial logic gates enabling a full-width signal when the programming number is not greater than the maximum number.

10. The system of claim 4 wherein the partitioning block comprises a plurality of combinatorial logic gates enabling a half-width signal when the programming number is greater than the maximum number and the maximum number is equal to one-half of the number of bits of the word.

11. The system of claim 4 wherein the partitioning block comprises a plurality of combinatorial logic gates enabling a quarter-width signal when the programming number is greater than the maximum number and the maximum number is equal to one-quarter of the number of bits of the word.

12. The system of claim 4 wherein the partitioning block comprises a plurality of combinatorial logic gates enabling an eighth-width signal when the programming number is greater than the maximum number and the maximum number is equal to one-eighth of the number of bits of the word.

13. The system of claim 4 wherein the switch generates one write pulse in response to a full-width signal, the write pulse enabling the separate communication path between the word and the memory.

14. The system of claim 4 wherein the switch generates two write pulses in response to a half-width signal, each write pulse enabling the separate communication path between a sub-word and the memory, each sub-word including half of the number of bits of the word.

15. The system of claim 4 wherein the switch generates four write pulses in response to a quarter-width signal, each write pulse enabling the separate communication path between a sub-word and the memory, each sub-word including one-quarter of the number of bits of the word.

16. The system of claim 4 wherein the switch generates eight write pulses in response to a eighth signal, each write pulse enabling the separate communication path between a sub-word and the memory, each sub-word including one-eighth of the number of bits of the word.

17. A memory system comprising:
a memory including a plurality of bits arranged as one or more words, each bit in each word being capable of being programmed either to a particular logical state or to another logical state; and
a variable data width controller in communication with the memory, the variable data width controller comprising:
an adder configured to determine a programming number of bits in a word to be programmed into a memory wherein each bit to be programmed is in the particular logical state, the adder comprising a plurality of asynchronous adders;
a partitioning block configured to divide the word into two or more sub-words when the programming number exceeds a maximum number; and
a switch in communication with the partitioning block, the switch being configured to sequentially provide one or more write pulses, each write pulse enabling a separate communication path between the memory and one of the word and the sub-words.

18. The memory system of claim 17 wherein the memory is a phase change memory and the particular logical state represents an amorphous state.

19. The memory system of claim 17 wherein the memory is a magneto-resistive random access memory.

* * * * *